(12) United States Patent
Ooi Zee Min

(10) Patent No.: US 10,309,990 B2
(45) Date of Patent: Jun. 4, 2019

(54) MEASURING AND ANALYZING DEVICE AS WELL AS METHOD FOR MEASURING AND ANALYZING SIGNALS

(71) Applicant: Rohde & Schwarz GmbH & Co. KG, Munich (DE)

(72) Inventor: Ben Ooi Zee Min, Kuala Lumpur (MY)

(73) Assignee: Rohde & Schwarz GmbH & Co. KG, Munich (DE)

(*) Notice: Subject to any disclaimer, the term of this patent is extended or adjusted under 35 U.S.C. 154(b) by 151 days.

(21) Appl. No.: 15/271,015

(22) Filed: Sep. 20, 2016

(65) Prior Publication Data

US 2018/0080964 A1  Mar. 22, 2018

(51) Int. Cl.
| | |
|---|---|
| *G01R 21/133* | (2006.01) |
| *G01R 27/28* | (2006.01) |
| *G01R 15/12* | (2006.01) |
| *G01R 23/16* | (2006.01) |

(52) U.S. Cl.
CPC ......... *G01R 15/125* (2013.01); *G01R 21/133* (2013.01); *G01R 23/16* (2013.01); *G01R 27/28* (2013.01)

(58) Field of Classification Search
CPC .... G01R 23/16; G01R 15/125; G01R 21/133; G01R 27/28
USPC ............................................ 324/76.19, 76.22
See application file for complete search history.

(56) References Cited

U.S. PATENT DOCUMENTS 7,925,464 B1* 4/2011 Bazemore ................ G01S 7/40
702/118

FOREIGN PATENT DOCUMENTS

CN  104133139 A  11/2014

* cited by examiner

*Primary Examiner* — Amy He
(74) *Attorney, Agent, or Firm* — Schwabe, Williamson & Wyatt, P.C.

(57) ABSTRACT

A measuring and analyzing device is described which comprises a housing, a spectrum analyzer unit for analyzing a spectrum of a signal received, and a multimeter unit for measuring currents, voltages, resistances and/or connectivities. Said housing encompasses said spectrum analyzer unit and said multimeter unit. Said device is a handheld and portable measuring and analyzing device. Further, a method for measuring and analyzing signals is described.

17 Claims, 2 Drawing Sheets

MEASURING AND ANALYZING DEVICE AS WELL AS METHOD FOR MEASURING AND ANALYZING SIGNALS

TECHNICAL FIELD

The invention relates to a measuring and analyzing device as well as a method for measuring and analyzing signals.

BACKGROUND OF THE INVENTION

Measuring and analyzing devices are known in the prior art which are typically used for certain technical fields. Depending on the technical field, first parameters can be measured and analyzed by a first device whereas second parameters have to be measured and analyzed by a second device. Particularly, handheld devices comprise typically at least one measurement and analyzing unit which allows to measure and analyze only one parameter and/or perform one measurement.

However, different handheld devices have to be used for obtaining information about different parameters.

Accordingly, customers have to purchase at least two different handheld devices to perform the different measurements and they have to transport these devices provided that they expect to measure the corresponding parameters which can be measured by these devices.

In general, the parameters to be measured by such a device are restricted due to the fact that each device can only be used for certain purposes. For instance, a handheld spectrum analyzer can only be used to analyze a spectrum of a signal received, in particular a radio frequency signal (RF signal).

SUMMARY OF THE INVENTION

The invention provides a measuring and analyzing device comprising a housing, a spectrum analyzer unit for analyzing a spectrum of a signal received, and a multimeter unit for measuring currents, voltages, resistances and/or connectivities wherein said housing encompasses said spectrum analyzer unit and said multimeter unit and wherein said device is a handheld and portable measuring and analyzing device.

The invention is based on the finding that two measurement and analyzing units can be combined in a single device such that it is not necessary for a customer to purchase two separate devices. Due to the new integrated technologies, system level printed circuit board sizes have shrunk considerably. Accordingly, smaller, cheaper and lighter hardware is available which makes it possible to integrate the spectrum analyzer unit as well as the multimeter unit in one single device which is called spectrum-multimeter analyzer. Despite the fact that the weight burden is reduced, measurement needs of customers are also addressed as the spectrum analyzer and the multimeter units are integrated in one single device. Accordingly, the measuring results can be directly processed by one single device which provides the possibility to measure and retrieve new parameters.

According to an aspect, said spectrum analyzer unit and said multimeter unit are electrically connected to each other such that said device is configured to perform measurements and analyzes using both said spectrum analyzer unit and said multimeter unit. Therefore, new measurements can be performed by coupling the characteristics of these individual measuring and analyzing units which are integrated in said single device.

For instance, said device is configured to measure power consumption with respect to generated output power. Therefore, the efficiency can be measured by said single device. As already mentioned, the measuring and analyzing device is a handheld and portable device such that the efficiency can be easily measured and analyzed. Normally, such measurements are not feasible as the spectrum analyzer device and the multimeter device are separately formed. Thus, the separate provided measuring results have had to be combined manually or they have had to be analyzed by another device, for instance a notebook or computer. The single device comprising said spectrum analyzer unit and said multimeter unit can directly retrieve these measuring results, in particular automatically.

Furthermore, said device may be configured to measure the efficiency of a source of said signal received, in particular by measuring a current. For instance, the single measuring and analyzing device can measure the direct current used to generate the signal received by the spectrum analyzer unit, particularly a radio frequency signal. Hence, the so called DC efficiency can be determined.

For processing purposes, the device may comprise a processing unit. This processing unit is used to process the received signals from the multimeter unit as well as the spectrum analyzer unit. Each of the units may have their own processing unit for obtaining the measuring results. Alternatively or supplementary, the integrated circuit comprises a processing unit.

According to another aspect, said device comprises an integrated circuit which is connected with said spectrum analyzer unit and said multimeter unit. The integrated circuit is connected to the spectrum analyzer unit as well as the multimeter unit. Accordingly, the integrated circuit can compare and use the data obtained by these units for further processing and analyzing. For instance the measuring results of both units are further processed by the integrated circuit in order to obtain new parameters which relate to the measuring results of the spectrum analyzer unit and the multimeter unit. These new parameters were not retrievable so far by a single device.

Particularly, analog/digital converters are provided for connecting said spectrum analyzer unit and said multimeter unit with said integrated circuit. The analog output signals of these units are converted into digital signals which can be processed by the integrated circuit.

According to an embodiment, said integrated circuit comprises a field programmable gate array. The field programmable gate array (FPGA) may be part of the integrated circuit. Alternatively, the whole integrated circuit is provided by the field programmable gate array. Generally, the field programmable gate array comprises several programmable logic blocks which can be controlled to process input signals accordingly, in particular signals received by the units.

Furthermore, said device may have a memory. The memory can be connected to the integrated circuit, in particular the field programmable gate array, such that the processed data can be at least partially stored. Thus, the integrated circuit may have access to the memory for looking-up former measuring results and/or using former measuring results in order to provide comparable data.

According to another aspect, the device may also comprise a power control. The power control may be a high-precision power control ensuring high efficiency operation of the device. Further, the power control can be used to reduce the power consumption of the single measuring and analyzing device by controlling the power consumption of the spectrum analyzer unit as well as the multimeter unit depending on the intended measurement to be performed. For instance, the multimeter unit is switched off during measurements which only use the spectrum analyzer unit and vice versa. Thus, the power consumption of the whole device is optimized.

Further, said device may have an audio feedback unit. This audio feedback unit can be used to issue audio signals for informing the user about aspects related to the measurement, for instance the ending of a measurement and/or reaching a certain value, particularly a threshold value.

The device may be a spectrum-multimeter analyzer as the functions of a spectrum analyzer and a multimeter are combined in said single device.

Further, the invention provides a method for measuring and analyzing signals, wherein a handheld and portable measuring and analyzing device is used comprising a spectrum analyzer unit for analyzing a spectrum of a signal received and a multimeter unit for measuring currents, voltages, resistances and/or connectivities wherein said spectrum analyzer unit analyzes said signal received and wherein said multimeter unit measures a parameter of the source emitting said signal. Accordingly, two completely different parameters can be measured simultaneously with one single device such that new information can be gathered which can be used to analyze the source of the signal. In general, this method refers to using a spectrum-multimeter analyzer comprising a spectrum analyzer unit and a multimeter unit within one single device.

According to an aspect, power efficiency measurements may be performed. Thus, a completely new parameter can be measured, analyzed and provided while using a spectrum-multimeter analyzer comprising a spectrum analyzer unit and a multimeter unit. The new parameters can be measured since the spectrum analyzer unit and the multimeter unit are electrically connected with each other and integrated in a single device. Accordingly, the single device may perform the measurements and analyzes while using both said spectrum analyzer unit and said multimeter unit. The data and information retrieved by the several units are combined such that the new parameters can be gathered and processed, accordingly.

An example method for measuring and analyzing signals is disclosed, wherein:
a) a handheld and portable measuring and analyzing device is used comprising
b) a spectrum analyzer unit for analyzing a spectrum of a signal received and
c) a multimeter unit for measuring currents, voltages, resistances and/or connectivities;
d) wherein said spectrum analyzer unit analyzes said signal received, and
e) wherein said multimeter unit measures a parameter of the source emitting said signal.

BRIEF DESCRIPTION OF DRAWINGS

The invention will now be described with reference to a preferred embodiment which is shown in the enclosed drawings. In the drawings, FIG. 1 schematically shows a measuring and analyzing device according to the invention.

DETAILED DESCRIPTION OF THE INVENTION

Figure 1:
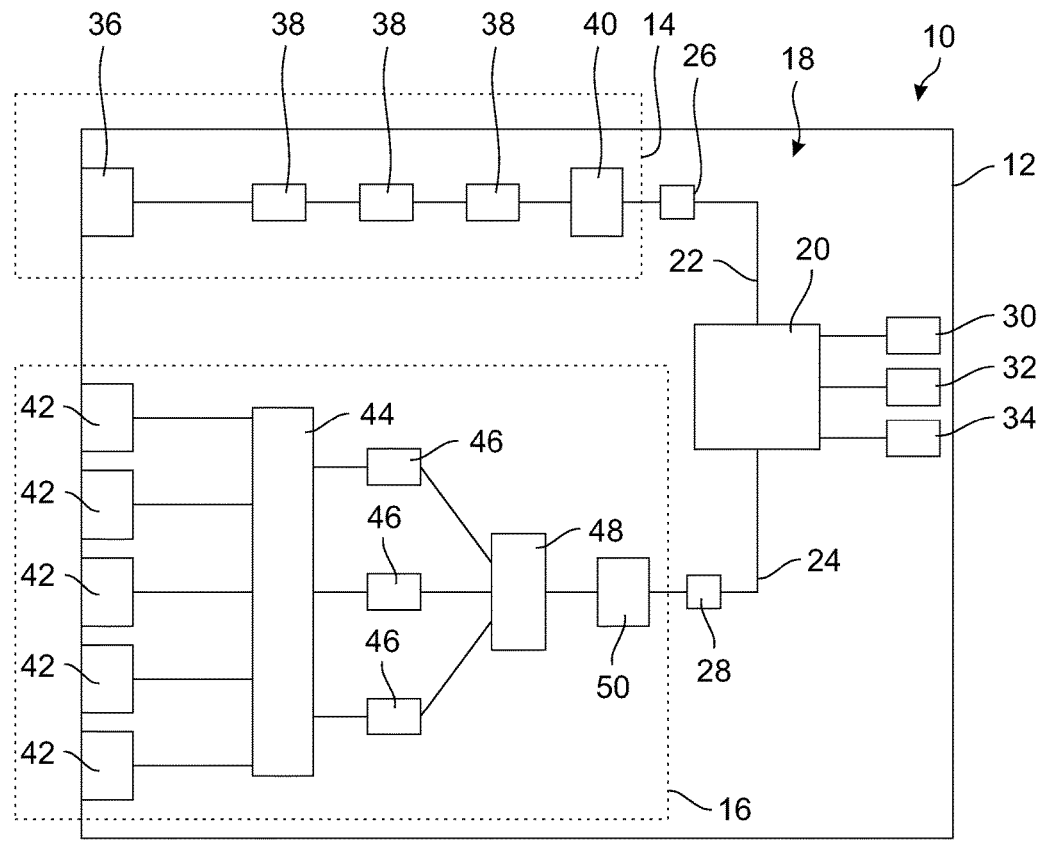

FIG. 1 schematically shows a measuring and analyzing device 10 which comprises a housing 12 encompassing a spectrum analyzer unit 14 for analyzing a spectrum of a signal received and a multimeter unit 16 for measuring currents, voltages, resistances and/or connectivities.

As shown in FIG. 1, both units 14, 16 are encompassed by the single housing 12 such that the single measuring and analyzing device 10 comprises the functions of a spectrum analyzer and a multimeter which are usually separately formed. This single measuring and analyzing device 10 can be called a spectrum-multimeter analyzer.

The measuring and analyzing device 10 further comprises an integrated circuit 18 which has a field programmable gate array 20 (FPGA). This field programmable gate array 20 is connected via two lines 22, 24 with the spectrum analyzer unit 14 as well as a multimeter unit 16.

In these lines 22, 24, analog/digital converters 26, 28 are provided which are used to connect the spectrum analyzer unit 14 and the multimeter unit 16 to the integrated circuit 18 such that analog output signals of the units 14, 16 are digitalized by the corresponding converters 26, 28.

Further, the integrated circuit 18 comprises a memory 30, a power control 32 as well as an audio feedback unit 34 which each are connected to the field programmable gate array 20.

In addition, the device 10 comprises at least one processing unit. According to the shown embodiment, the spectrum analyzer unit 14 as well as the multimeter unit 16 each comprise an own processing unit which is used to process and analyze the incoming signals as will be described later.

Alternatively or supplementary, the integrated circuit 18 may comprise a processing unit which is used to process the already processed data received from the units 14, 16, for instance for calculating new parameters which will also be described later.

As shown in FIG. 1, the spectrum analyzer unit 14 has an input 36 for receiving a signal, for instance a radio frequency signal (RF signal). Further, the spectrum analyzer unit 14 comprises processing and analyzing elements 38 which are used to process and analyze the incoming signal(s), for instance a filter, an amplifier, a detector, a mixer and/or a logarithmic unit. Afterwards, the processed and analyzed signal is outputted via an output 40 of the spectrum analyzer unit 14. The signal outputted via the output 40 is an analog signal which is digitalized by the analog/digital converter 26 which is connected to the integrated circuit 18 via the line 22. Then the digitalized output signal of the spectrum analyzer unit 14 can be processed by the integrated circuit 18, in particular the field programmable gate array 20.

Further, the multimeter unit 16 comprises several inputs 42 which can be used to plug in cables, lines, wires or other electrically conducting elements. For example, a first input 42 corresponds to a current measurement input whereas a second input 42 corresponds to a resistance measuring input. Alternatively, a single input 42 is used for different measurements.

Moreover, two inputs 42 can be used simultaneously for certain measurements, for instance voltage measurements.

The several inputs 42 are connected to a switching and ranging unit 44 of the multimeter unit 16 such that incoming signals are adjusted to a certain range which can be processed by the multimeter unit 16.

Furthermore, the multimeter unit 16 comprises several measuring and analyzing elements 46, e.g. current shunts, root mean square to direct current converters (RMS to DC converters) for measuring alternating currents and/or resistances serving as current sources. These measuring and analyzing elements 46 are used for measuring, processing and analyzing the different incoming signals of the multimeter unit 16.

The multimeter unit 16 further comprises a switching element 48 which is connected to the measuring and analyzing elements 46 such that the different measuring and analyzing elements 46 can be combined in a certain manner, in particular their output signals, which might be necessary for obtaining the desired information and/or parameters about the received signal. The switching element 48 is connected to an output 50 of the multimeter unit 16 which is connected to the line 24 via the analog/digital converter 28.

Accordingly, the analog signals outputted via the outputs 40, 50 of both the spectrum analyzer unit 14 and the multimeter unit 16 are converted by the analog/digital converters 26, 28 such that the integrated circuit 18 receives digital signals which can be processed by the integrated circuit 18.

As the units 14, 16 are connected with the integrated circuit 18 simultaneously, the integrated circuit 18 can obtain information from both units 14, 16 such that new parameters can be measured, for instance efficiency of a source emitting a signal received by the spectrum analyzer unit 14.

Figure 2:
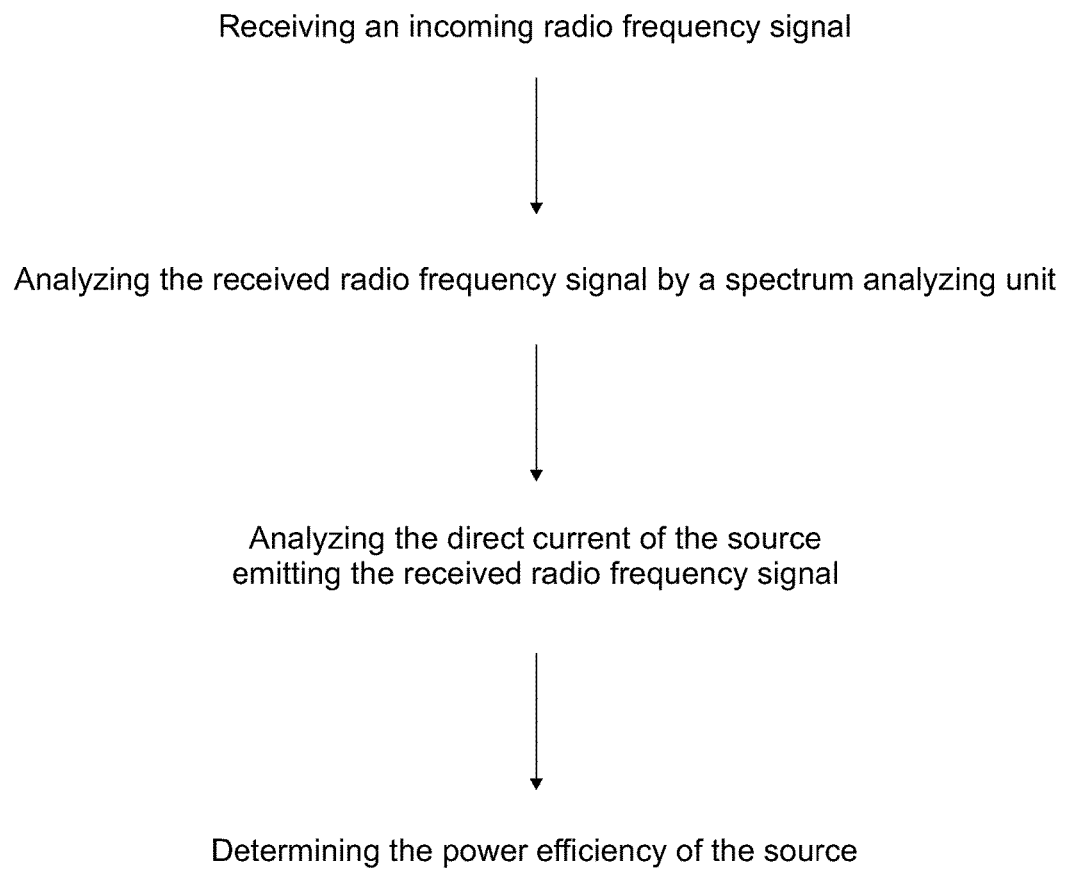
FIG. 2 shows a flow chart representing a method for measuring and analyzing signals according to the invention.

The device 10 comprising the spectrum analyzer unit 14 and the multimeter unit 16 in an electrically connected manner enables the possibility to measure new parameters as will be explained with respect to FIG. 2 which shows a flow chart of a method for measuring and analyzing signals with a device 10 as shown in FIG. 1.

First, the device 10 is connected to a source emitting radio frequency signals, in particular the multimeter unit 16 of the device 10 is connected to the source via a cable.

Then, the source is switched on such that a radio frequency signal is generated which is received by the device 10, in particular the spectrum analyzer unit 14.

The spectrum analyzer unit 14 processes and analyzes the received radio frequency signal such that the power of the signal is gathered, for example.

Simultaneously, the multimeter unit 16 measures and analyzes the direct current used by the source emitting the radio frequency signal for generating such signal.

Both measuring and analyzing results gathered by the units 14, 16 are transmitted to the integrated circuit 18 which combines these results such that a new parameter can be obtained, for instance the power efficiency of the source. This is possible since the device 10 gathers information about the signal generated by the source, in particular the power of the radio frequency signal, as well as the power required by the source to generate this signal. Thus, the efficiency of the source can be determined by the single device 10.

Accordingly, the power consumption versus generated output power is accessible by this single device 10, in particular the required direct current versus the generated radio frequency output power. Thus, the DC power consumption versus the generated radio frequency (RF) output can be determined.

In general, only one device is used to perform measurements which have been performed by two separate devices previously. Accordingly, the single measuring and analyzing device 10 can be used to perform the usual measurements of a spectrum analyzer such as radio frequency power and/or the typical measurements of a multimeter such as power, current, and voltage measurements as well as resistance, connectivity and/or diode voltage measurements.

In addition, a low weight and efficient measuring and analyzing device is provided which can be used to measure completely new parameters which could not be measured before. Accordingly, new parameters are also obtainable, in particular in an automatic manner. Furthermore, a new method for measuring and analyzing signals is provided.

The invention claimed is:

1. A measuring and analyzing device comprising:
   a housing;
   a spectrum analyzer unit for analyzing a spectrum of a signal received; and
   a multimeter unit for measuring currents, voltages, resistances and/or connectivities;
   said housing encompassing said spectrum analyzer unit and said multimeter unit, and
   said device being a handheld and portable measuring and analyzing device;
   said spectrum analyzer unit and said multimeter unit are electrically connected to each other such that said device is configured to perform measurements and analyses using both said spectrum analyzer unit and said multimeter unit,
   the device being configured to perform new measurements by coupling the characteristics of said spectrum analyzer unit and said multimeter unit.

2. The measuring and analyzing device according to claim 1, wherein said device is configured to measure power consumption with respect to generated output power.

3. The measuring and analyzing device according to claim 1, wherein said device is configured to measure the efficiency of a source of said signal received, in particular by measuring a current.

4. The measuring and analyzing device according to claim 1, wherein said device comprises a processing unit.

5. The measuring and analyzing device according to claim 1, wherein said device comprises an integrated circuit which is connected with said spectrum analyzer unit and said multimeter unit.

6. The measuring and analyzing device according to claim 5, wherein analog/digital converters are provided for connecting said spectrum analyzer unit and said multimeter unit with said integrated circuit.

7. The measuring and analyzing device according to claim 5, wherein said integrated circuit comprises a field programmable gate array.

8. The measuring and analyzing device according to claim 1, wherein said device has a memory.

9. The measuring and analyzing device according to claim 1, wherein said device comprises a power control.

10. The measuring and analyzing device according to claim 1, wherein said device has an audio feedback unit.

11. The measuring and analyzing device according to claim 1, wherein said device is a spectrum-multimeter analyzer.

12. The measuring and analyzing device according to claim 1, wherein said spectrum analyzer unit comprises an input for receiving a radio frequency signal, said multimeter unit comprising several inputs, said spectrum analyzer unit and said multimeter unit each having an output.

13. A method for measuring and analyzing signals, wherein a handheld and portable measuring and analyzing device is used comprising:
   a spectrum analyzer unit for analyzing a spectrum of a signal received; and
   a multimeter unit for measuring currents, voltages, resistances and/or connectivities;

wherein said spectrum analyzer unit analyzes said signal received, and wherein said multimeter unit measures a parameter of the source emitting said signal.

14. The method according to claim 13, wherein power efficiency measurements are performed.

15. A measuring and analyzing device comprising
a housing,
a spectrum analyzer unit for analyzing a spectrum of a signal received,
a multimeter unit for measuring currents, voltages, resistances and/or connectivities, and
an integrated circuit which is connected with said spectrum analyzer unit and said multimeter unit so that the integrated circuit obtains information from both said spectrum analyzer unit and said multimeter unit simultaneously;
said housing encompassing said spectrum analyzer unit, said multimeter unit, and said integrated circuit,
said device being a handheld and portable measuring and analyzing device,
the measuring and analyzing results of said spectrum analyzer unit and said multimeter unit being further processed by said integrated circuit in order to obtain new parameters which relate to the measuring results of said spectrum analyzer unit and said multimeter unit.

16. The measuring and analyzing device according to claim 15, wherein analog/digital converters are provided for connecting said spectrum analyzer unit and said multimeter unit with said integrated circuit.

17. The measuring and analyzing device according to claim 15, wherein said spectrum analyzer unit comprises an input for receiving a radio frequency signal, said multimeter unit comprising several inputs, said spectrum analyzer unit and said multimeter unit each having an output.

* * * * *